(12) United States Patent
Manassen et al.

(10) Patent No.: US 11,119,417 B2
(45) Date of Patent: Sep. 14, 2021

(54) SINGLE CELL GREY SCATTEROMETRY OVERLAY TARGETS AND THEIR MEASUREMENT USING VARYING ILLUMINATION PARAMETER(S)

(71) Applicant: KLA-TENCOR CORPORATION, Milpitas, CA (US)

(72) Inventors: Amnon Manassen, Haifa (IL); Yuri Paskover, Binyamina (IL); Eran Amit, Haifa (IL)

( * ) Notice: Subject to any disclaimer, the term of this patent is extended or adjusted under 35 U.S.C. 154(b) by 56 days.

(21) Appl. No.: 16/491,963

(22) PCT Filed: Aug. 5, 2019

(86) PCT No.: PCT/US2019/045039
§ 371 (c)(1),
(2) Date: Sep. 6, 2019

(87) PCT Pub. No.: WO2020/106335
PCT Pub. Date: May 28, 2020

(65) Prior Publication Data
US 2020/0159129 A1    May 21, 2020

Related U.S. Application Data

(60) Provisional application No. 62/770,680, filed on Nov. 21, 2018.

(51) Int. Cl.
*G01B 11/02* (2006.01)
*G03F 7/20* (2006.01)
(Continued)

(52) U.S. Cl.
CPC ....... *G03F 7/70633* (2013.01); *G01B 9/0201* (2013.01); *G01B 11/272* (2013.01); *G01B 11/02* (2013.01)

(58) Field of Classification Search
CPC ............ G03F 7/70633; G03F 7/70616; G03F 7/70625; G03F 7/70775; G03F 9/7049;
(Continued)

(56) References Cited

U.S. PATENT DOCUMENTS

2003/0147086 A1    8/2003  Rosencwaig et al.
2004/0169861 A1*   9/2004  Mieher ............... G03F 7/70625
                                                        356/400
(Continued)

OTHER PUBLICATIONS

WIPO, ISR for PCT/US2019/045039, dated Nov. 18, 2019.

*Primary Examiner* — Tarifur R Chowdhury
*Assistant Examiner* — Jonathon Cook
(74) *Attorney, Agent, or Firm* — Hodgson Russ LLP

(57) ABSTRACT

Scatterometry overlay (SCOL) measurement methods, systems and targets are provided to enable efficient SCOL metrology with in-die targets. Methods comprise generating a signal matrix by: illuminating a SCOL target at multiple values of at least one illumination parameter, and at multiple spot locations on the target, wherein the illumination is at a NA (numerical aperture) >⅓ yielding a spot diameter <1μ, measuring interference signals of zeroth and first diffraction orders, and constructing the signal matrix from the measured signals with respect to the illumination parameters and the spot locations on the target; and deriving a target overlay by analyzing the signal matrix. The SCOL targets may be reduced to be a tenth in size with respect to prior art targets, as less and smaller target cells are required, and be easily set in-die to improve the accuracy and fidelity of the metrology measurements.

13 Claims, 3 Drawing Sheets

(51) Int. Cl.
*G01B 9/02* (2006.01)
*G01B 11/27* (2006.01)

(58) Field of Classification Search
CPC ............ G01B 9/0201; G01B 9/02002; G01B 11/272; G01B 11/02
See application file for complete search history.

(56) References Cited

U.S. PATENT DOCUMENTS

| | | |
|---|---|---|
| 2006/0066855 A1* | 3/2006 | Boef ................... G03F 7/70341 356/401 |
| 2015/0177135 A1* | 6/2015 | Amit .................. G01N 21/4785 702/150 |
| 2015/0219449 A1 | 8/2015 | Bringoltz et al. |
| 2016/0161245 A1* | 6/2016 | Fu .......................... G01B 11/24 250/208.2 |
| 2016/0313658 A1* | 10/2016 | Marciano ............ G03F 7/70633 |
| 2017/0060001 A1 | 3/2017 | Adel et al. |
| 2017/0268869 A1 | 9/2017 | Levinski et al. |
| 2017/0269482 A1* | 9/2017 | Boonzajer Flaes ......................... G03F 7/70633 |
| 2018/0023950 A1 | 1/2018 | Marciano et al. |
| 2018/0031424 A1* | 2/2018 | Hill ..................... G01B 11/272 |
| 2018/0088470 A1* | 3/2018 | Bhattacharyya .... G03F 7/70633 |
| 2018/0252514 A1 | 9/2018 | Pandev et al. |
| 2019/0072862 A1* | 3/2019 | Tarabrin ................ G03F 7/7085 |
| 2019/0086201 A1* | 3/2019 | Den Boef ............... G03F 7/705 |
| 2019/0107786 A1* | 4/2019 | Van Boxmeer ..... G03F 7/70158 |

\* cited by examiner

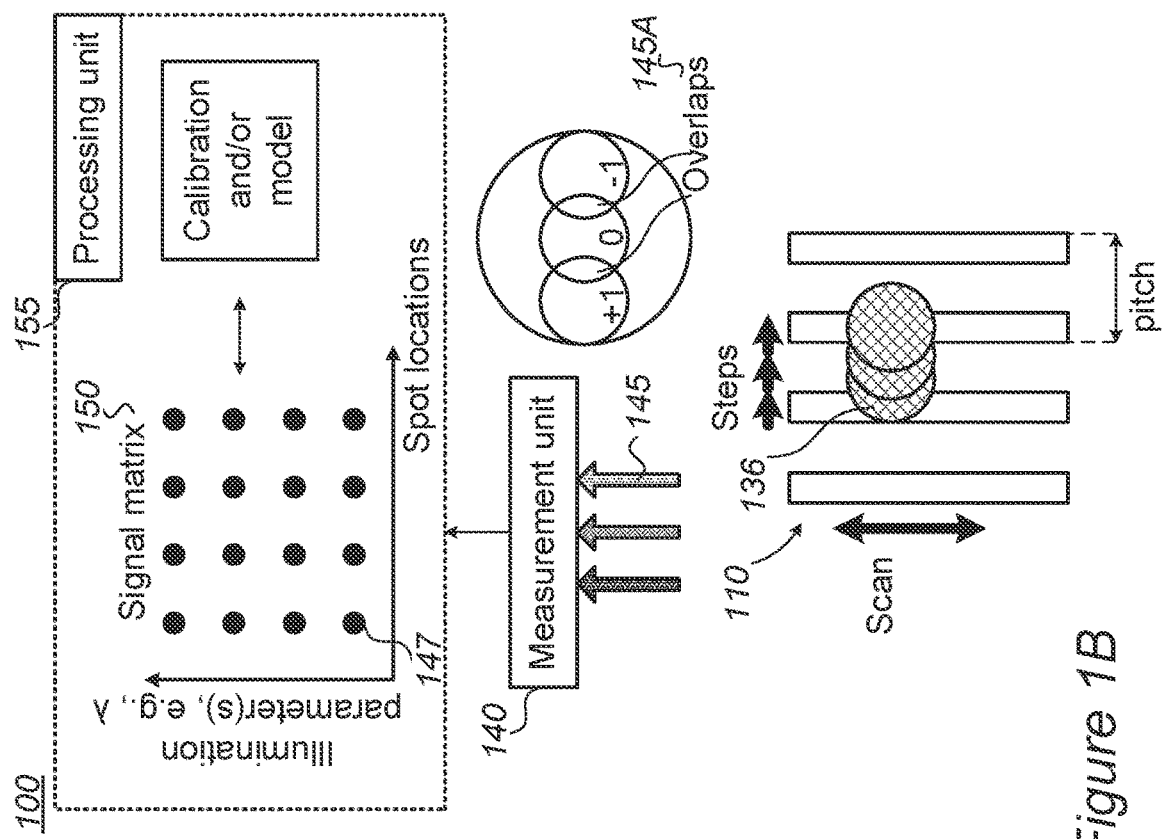
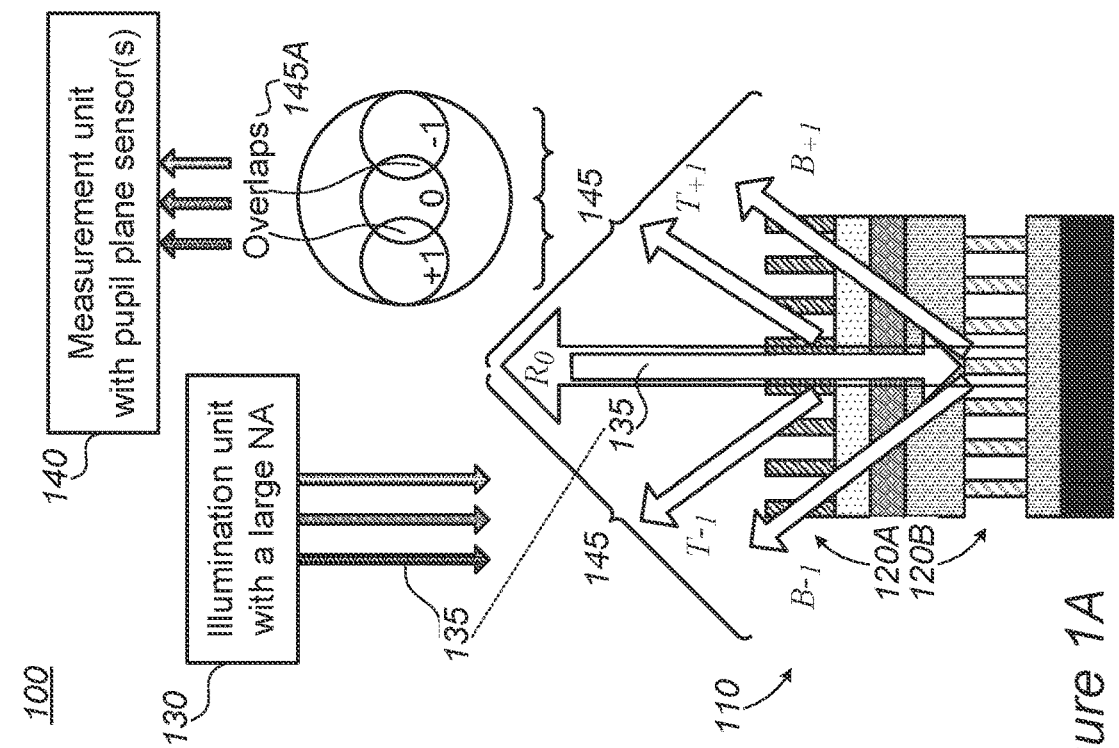
Figure 1A
Figure 1B

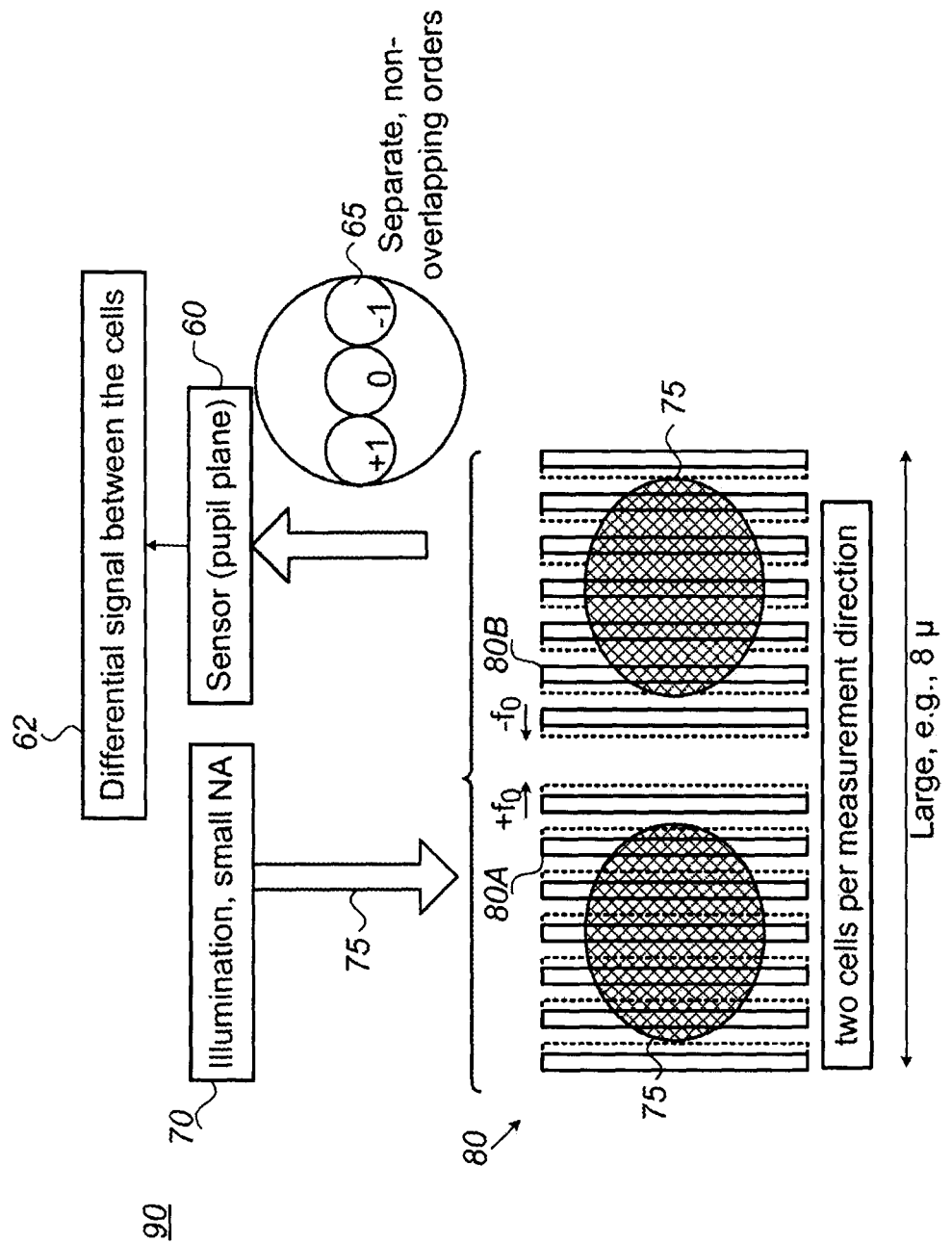
Figure 2 - Prior art

SINGLE CELL GREY SCATTEROMETRY OVERLAY TARGETS AND THEIR MEASUREMENT USING VARYING ILLUMINATION PARAMETER(S)

BACKGROUND OF THE INVENTION

1. Technical Field

The present invention relates to the field of semiconductor metrology, and more particularly, to scatterometry overlay (SCOL) targets and metrology modules and methods for measuring them.

2. Discussion of Related Art

Typical SCOL metrology utilizes multiple cells having multiple periodic structures in corresponding layers, which are displaced with respect to each other by predetermined offsets to enable the derivation of the overlay from differential signals between the cells.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides scatterometry overlay (SCOL) measurement method comprising: generating a signal matrix by: illuminating a SCOL target at multiple values of at least one illumination parameter, and at multiple spot locations on the target, wherein the illumination is at a NA (numerical aperture) >⅓ yielding a spot diameter <1µ, measuring interference signals of zeroth and first diffraction orders, and constructing the signal matrix from the measured signals with respect to the illumination parameters and the spot locations on the target; and deriving a target overlay by analyzing the signal matrix.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 1A and 1B are high-level schematic illustrations of SCOL targets and respective measurement systems, according to some embodiments of the invention FIG. 2 is a schematic illustration of a SCOL target and its measurement procedure, according to the prior art.

DETAILED DESCRIPTION OF THE INVENTION

Figure 3:
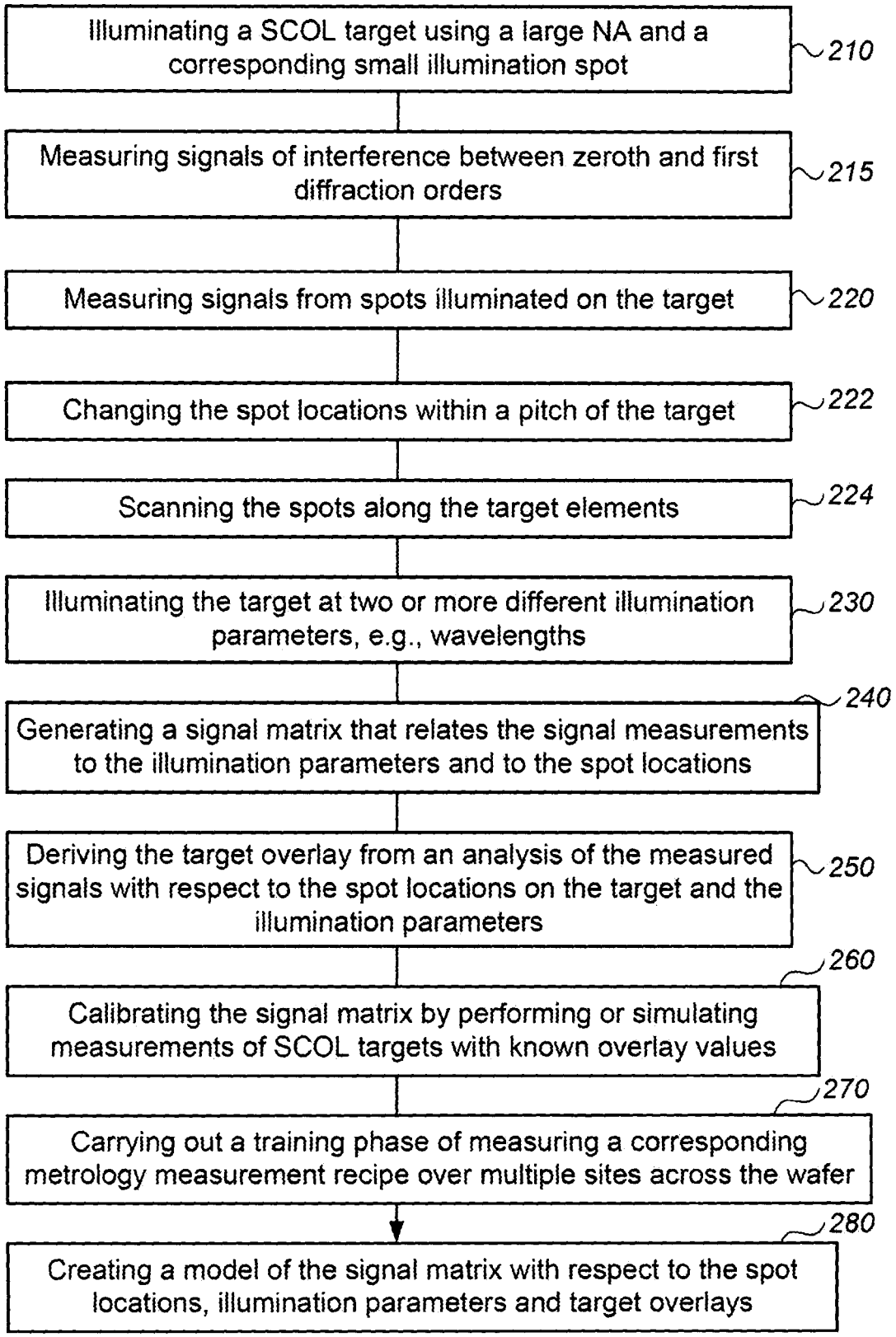
FIG. 3 is a high-level flowchart illustrating a method, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining" "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanism for scatterometry overlay (SCOL) metrology measurements and thereby provide improvements to the technological field of semiconductor metrology. Scatterometry overlay (SCOL) measurement methods, systems and targets are provided to enable efficient SCOL metrology with in-die targets. Methods comprise generating a signal matrix by: illuminating a SCOL target at multiple values of at least one illumination parameter, and at multiple spot locations on the target, wherein the illumination is at a NA (numerical aperture) >⅓ yielding a spot diameter <1µ, measuring interference signals of zeroth and first diffraction orders, and constructing the signal matrix from the measured signals with respect to the illumination parameters and the spot locations on the target; and deriving a target overlay by analyzing the signal matrix. The SCOL targets may be reduced to be a tenth in size with respect to prior art targets, as less and smaller target cells are required, and be easily set in-die to improve the accuracy and fidelity of the metrology measurements. The small spots, the use of varying illumination parameters and quick spot scanning methods, enable using single cells instead on pairs of cells with opposite predefined offsets, and enable reducing the cell size together with the spot size reduction.

FIGS. 1A and 1B are high-level schematic illustrations of a SCOL target 110 and its measurement system 100, according to some embodiments of the invention. System 100, e.g., a metrology system or module therewithin, may be configured to illuminate SCOL target 110 having periodic structures 120A, 120B (e.g., gratings) using a large NA (numerical aperture) illumination unit 130 (e.g., having NA>⅓ such as any of NA=0.4, 0.5, 0.6, 0.7, 0.8, 0.9, or other values— with orders −1, 0 and +1 at least partly overlapping 145A in the pupil plane) resulting in corresponding small illumination spots 136, e.g., smaller than 1µ, or possibly between any of 250-1000 nm or 600-1000 nm. In FIG. 1A, SCOL target 110 is illustrated in schematic cross-section view, with intermediate layers between top periodic structure 120A and bottom periodic structure 120B, and notation of illumination 135, reflection signal ($R_0$ denoting the zeroth order) and ±1 order diffracted signals 145, denoted by and $T_{\pm 1}$ and $B_{\pm 1}$ for top and bottom ±1 diffraction orders, respectively. In FIG. 1B, SCOL target 110 is illustrated in schematic top view, and may have an offset (not shown) between periodic structures 120A, 120B.

System 100 may be configured to illuminate SCOL target 110 at a plurality of spot locations 136 on target 110, which may be stepped along the measurement direction(s) of periodic structure(s) 120A, 120B of SCOL target 110 and possibly scanned along the elements of periodic structure(s) 120A, 120B (perpendicular to the measurement direction) for averaging the measured signals. Spot locations 136 may be selected to be within a pitch of periodic structure(s) 120A, 120B of SCOL target 110, as illustrated schematically in FIG. 1B. It is noted that spot locations 136 may be spread over two or more pitches, yet at least two of the spot locations should be not equivalent with respect to the target periodicity, to yield non-equivalent signals for analysis. Selecting spot locations 136 within one (or two) target pitches enables a significant reduction in target size, compared with prior art that requires many target pitches to be covered by the large prior art illumination spot.

System 100 further comprises a measurement unit 140 with pupil plane sensor(s) configured to measure a corresponding plurality of measurement signals 145 from multiple spot locations 136 on target 110. Signals 145 comprise interference signals of zeroth and first order diffractions components of the illumination from each spot location 136, as illustrated schematically by overlaps 145A in FIGS. 1A and 1B. Such interference is due to using small illumination spots 135 and measurement may utilize changes in signal intensity to isolate or evaluate first order signal fluctuations from background zeroth order reflections. SCOL targets 110 may comprise a single cell, from which all signals may be derived and the corresponding overlay may be calculated. Analysis of signals 145 may be carried out as taught by U.S. Patent Application Publication No. 2017/0268869, which is incorporated herein by reference in its entirety.

System 100 may be configured to carry out illumination 130 at least at two different illumination parameters (denoted as "grey" SCOL), e.g., using multiple different wavelengths (e.g., three or more), using different focus and/or positions (possibly involving scanning the target), different polarizations, etc., and to derive the target overlay from an analysis of measured signals 145 with respect to the spot locations on target 110 and the illumination parameters. It is noted that one, two, three or more illumination parameters may be used in the measurements, in certain embodiments, using three illumination parameter values was found to be optimal in some cases with respect to measurement and overlay derivation complexities.

System 100 further comprises a processing unit 155 configured to construct a signal matrix 150 from measured signals 145 with respect to the illumination parameters and the spot locations on target 110, and to derive the target overlay by analyzing signal matrix 150. As measurements employ multiple small spots 135, having different illumination characteristics, to multiple spot locations 136 on target 110 that yield interfered (mixed) diffraction orders from corresponding signals 145—resulting signal matrix 150 may be used to derive and analyze the signals 147 with respect to spot locations 136 and illuminating characteristics to derive the target overlay.

System 100 may be further configured to calibrate signal matrix 150 by performing or simulating measurements of SCOL targets with known overlay values. For example, multiple reference targets, possibly on reference wafer(s), with known overlays may be measured by system 100 and the measurements may be used to generate a model relating measurement results to the known overlays. Alternatively or complementarily, simulations may be used to suggest relations between overlays and signals, and possibly to optimize the illumination parameters used (e.g., wavelengths values, other illumination parameters) as well as spot size and NA, stepping and scanning methods and parameters of spots 135 over target 110 etc. System 100 may be further configured to create a model of signal matrix 150 with respect to spot locations 136, illumination parameters and target overlays. Calibration may be carried out in a training phase or on-the-fly. Scanning targets 110 with small spots 135 may be carried out, e.g., by scanning over a length scale of one target pitch (or, e.g., two target pitches), e.g., smaller than 1µ.

In certain embodiments, target 110 may be designed to have periodic structures with specified pitches along two measurement directions, and system 100 may be configured to derive measurements using the same cell for both directions, with corresponding signal matrices 150 derived for each direction, possibly simultaneously, and analyzed to derive respective overlays as disclosed above.

In various embodiments, a formalism may be used to derive the relation between the overlay and the measurement results with multiple illumination parameters, based e.g., on electromagnetic modelling and/or simulation of optical path differences (OPDs), that relate changes in the strength of the diffracted fields with the changing illumination parameters—with respect to the overlay. Following corresponding analysis, simulation and/or training, direct relations may be established between the overlay and the measurement results.

For example, the inventors have noted that the ratio of the sum of differential signals to the difference of signal sums in the two measurement wavelengths depends only on the difference between the OPDs at the two wavelengths (or generally at the two measurement conditions), and not on the OPDs themselves. Therefore, in certain embodiments, this expression may be a stable parameter between process variations. For example, the measurement signals may be modelled while maintaining a relation between the illumination parameters and intensity measurements and/or accuracy metrics associated therewith.

In certain embodiments, landscape shifts with process variation may be utilized to derive overlays and/or to decouple between the overlay and target asymmetries, landscapes comprising an at least partially continuous dependency of at least one metrology metric on at least one parameter, as taught e.g., by U.S. Application Publication Nos. 2016/0313658 and 2018/0023950, incorporated herein by reference in their entirety. For example, measurements may be carried out at flat and resonant regions of the landscape to derive the overlay (and/or process variation). In certain embodiments, opposite predetermined offsets may be set in single target at different sites on the wafer, and the derivation may take into account the relative effects of these intended offsets.

In certain embodiments, a training phase may include measuring the metrology measurement recipe over multiple sites across the wafer, and modelling from the measurements, at least partly, the relation between the changes in illumination parameters and the changes in OPDs—which may then be used to derive the overlays. For example, certain wavelength ranges may be used for the measurements, with respect to certain ranges of changes in OPD.

FIG. 2 is a schematic illustration of a SCOL target 80 and its measurement procedure 90, according to the prior art. Prior art SCOL targets 80 typically comprise at least two cells 80A, 80B in each measurement direction, which comprise two or more periodic structures in corresponding layers, which are displaced with respect to each other by opposite predetermined offsets $+f_0$ and $-f_0$, illustrated schematically. Cells 80A, 80B are used to extract the (unintended) overlay between the periodic structures from measured diffraction signals from cells 80A, 80B. Measurements 90 are carried out by providing illumination and measurement conditions which prevent overlap of the diffraction orders 65 (e.g., $+1^{st}$, $-1^{st}$) with the reflected illumination (zeroth order) at the pupil plane of a respective sensor 60. The required prior art illumination conditions (of illumination unit 70) include a small numerical aperture (NA) which creates a large illumination spot 75 on cells 80A, 80B, and provides the required diffraction order isolation on sensor 60. For example, small illumination NA (e.g., NA=0.1, 0.2, 0.3 or other values smaller than about a third—with orders $-1$, $0$ and $+1$ not overlapping in the pupil plane) may be configured to result in illumination spot 75 being 1µ or more, to ensure scattered orders separation. The overlay is then calculated from the differential signal between the cells 62. It is noted that large illumination spot 75 requires prior art cells 80A, 80B to be large, and the minimal requirement of two cells per direction (for providing the opposite predetermined offsets $\pm f_0$) further increases the size of prior art SCOL targets 80, reaching typically e.g., 8µ×8µ (cell size) or larger.

Advantageously, the inventors have found out that in contrast to prior art, a single cell approach to SCOL is attainable using a small illumination spot and multiple illumination parameter(s) values, such as multiple wavelengths instead of using prior art cell pairs with opposite predetermined offsets. For example, modification of illumination parameters was found to be related to fluctuation in measured signal intensities (and/or related accuracy metrics), which were then used to derive data concerning the respective measured targets. Advantageously, the disclosed approach reduces significantly the real estate required for the metrology target, possibly enabling in-die metrology—due to using a single cell instead of two cells for each measurement direction and as the cells can be made smaller due to the use of a small illumination spot. It is noted that that significant reduction in real estate is achieved at the cost of requiring measurements with multiple measurement parameters and possibly target scanning (which may take longer and require illumination modification) and possibly at the cost of making the calibration more empirical in nature, as the derivation of the overlay from the measurement data is less straightforward than in the prior art. The derivation of the overlay from the calibrated measurements may be carried out analytically, e.g., using simulations, in a training phase, using calibration wafer(s) and/or using simulation. It is emphasized though, that following initial calibration and training, the derivation of the overlay is expected to be at least as fast as in the prior art.

According to initial modelling, in certain embodiments, SCOL targets 110 may be significantly smaller than prior art SCOL targets 80—due to their reduction to one cell 115 for each measurement direction (or possibly using the same cell for both directions) and optional reduction of cell size due to using smaller spot 135. For example, single cell targets 110 may be four or less pitch bars (periodic structure elements) wide, possibly one or two pitch bars wide. As a result, SCOL targets 110 may be down to ten times smaller than prior art SCOL targets 80 (e.g., measure 2µ×2µ or smaller, vs. 8µ×8µ or larger, respectively). Periodic structures 120A, 120B in multiple layers of SCOL target 110 may be aligned, as prior art predefined offsets may not be necessary in the current invention (they are used in the prior art to provide differential signal 62, which may be presently replaced by signal matrix 150). It is noted that multiple illumination characteristics may be used in various embodiments to extract the overlay from the different responses of periodic structures 120A, 120B, rather than the predetermined offsets used in the prior art.

Advantageously, disclosed small SCOL targets 110 are readily designed as in-die targets or marks, providing higher metrology accuracy and fidelity with respect to the semiconductor devices on the wafer.

In various embodiments, disclosed systems 100, targets 110 and methods 200 may increase the illumination NA to provide signals including zeroth and first order mixing, which is utilized by spot scanning to detect the resulting modulation (as the spot is scanned and/or as the illumination characteristics are changed) in the overlapping orders over the pupil area. Measurements with multiple wavelengths include information for deriving the overlay without the need for an additional cell. System 100 may implement fast spot scanning and fast wavelength switching so that the data required for the disclosed measurements is collected with minimal or no MAM (move-acquire-measure) penalty relative to specified requirements, and thereby enable in-die small targets required by customers.

FIG. 3 is a high-level flowchart illustrating a method 200, according to some embodiments of the invention. The method stages may be carried out with respect to SCOL targets 110 and/or measurement systems 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise metrology measurements derived by embodiments of method 200. Method 200 may comprise the following stages, irrespective of their order.

Scatterometry overlay (SCOL) measurement method 200 comprises generating a signal matrix (stage 240) by: illuminating a SCOL target, wherein the illumination is at a large NA (numerical aperture) $>\frac{1}{3}$ yielding a small spot diameter $<1µ$ (stage 210), at multiple spot locations on the target (stage 220), and at multiple values of at least one illumination parameter (stage 230), e.g., three or more wavelengths, and measuring interference signals of zeroth and first diffraction orders (stage 215). The signal matrix is then constructed from the measured signals with respect to the illumination parameters and the spot locations on the target (stage 240). Method 200 further comprises deriving a target overlay by analyzing the signal matrix, e.g., from an analysis of the measured signals with respect to the spot locations on the target and the illumination parameters (stage 250).

The SCOL target may comprise at least one periodic structure and the multiple spot locations may be within one pitch (or two pitches) of the at least one periodic structure, so that non-equivalent spot locations with respect to the periodicity of the target are used. The spot locations on the target may be set within the target pitch along a measurement direction of the at least one periodic structure, changing the spot locations within the target pitch (stage 222), and the measured signal may be averaged in a direction perpendicular to the measurement direction, by scanning the spots along the target elements (stage 224).

In certain embodiments, SCOL measurement method 200 may further comprise calibrating the signal matrix by performing or simulating measurements of SCOL, targets with known overlay values (stage 260).

In certain embodiments, SCOL measurement method 200 may further comprise carrying out a training phase of measuring a corresponding metrology measurement recipe over multiple sites across the wafer (stage 270).

In certain embodiments, SCOL measurement method 200 may further comprise creating a model of the signal matrix with respect to the spot locations, illumination parameters and target overlays (stage 280).

In certain embodiments, method 200 as a SCOL target design method may comprise designing the SCOL target as a single cell target and/or as being 2μ×2μ or smaller, and possibly placed in-die on a corresponding wafer. In certain embodiments, method 200 may further comprise configuring the periodic structures of the target to be aligned and/or be at most four, three, or two pitch bars (periodic structure elements) wide, possibly even one pitch wide. Certain embodiments comprise target design files of SCOL targets 110 and/or SCOL targets designed by the SCOL target design method.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A scatterometry overlay (SCOL) measurement method comprising:
   generating a signal matrix by:
   illuminating a SCOL target at multiple values of at least one illumination parameter, and at multiple spot locations on the target, wherein the illumination is at a numerical aperture (NA) greater than $\frac{1}{3}$ yielding a spot diameter less than $1\mu$,
   measuring interference signals of a zeroth diffraction order and a first diffraction order, and
   constructing the signal matrix from the measured interference signals with respect to the illumination parameters and the spot locations on the target, and
   deriving a target overlay by analyzing the signal matrix.

2. The SCOL measurement method of claim 1, wherein the SCOL target comprises at least one periodic structure and the multiple spot locations are within a pitch of the at least one periodic structure.

3. The SCOL measurement method of claim 2, further comprising setting the multiple spot locations on the target within the target pitch along a measurement direction of the at least one periodic structure, and averaging the measured interference signal in a direction perpendicular to the measurement direction.

4. The SCOL measurement method of claim 1, wherein the at least one illumination parameter comprises an illumination wavelength, and the multiple values thereof comprise at least three illumination wavelengths.

5. The SCOL measurement method of claim 1, further comprising calibrating the signal matrix by performing or simulating measurements of SCOL targets with known overlay values.

6. The SCOL measurement method of claim 5, further comprising creating a model of the signal matrix with respect to the spot locations, illumination parameters, and target overlays.

7. A computer program product comprising a non-transitory computer readable storage medium having computer readable program for executing one or more instructions on a processor comprising the SCOL measurement method of claim 1.

8. A metrology module comprising the computer program product of claim 7.

9. A scatterometry overlay (SCOL) measurement system comprising:
   an illumination unit configured to illuminate a SCOL target at multiple values of at least one illumination parameter, and at multiple spot locations on the target, wherein the illumination is at a numerical aperture (NA) greater than $\frac{1}{3}$ yielding a spot diameter less than $1\mu$,
   a measurement unit configured to measure interference signals of a zeroth diffraction order and a first diffraction order, and
   a processing unit configured to construct a signal matrix from the measured interference signals with respect to the illumination parameters and the spot locations on the target, and derive a target overlay by analyzing the signal matrix.

10. The SCOL measurement system of claim 9, further configured to set the multiple spot locations on the target within a target pitch along a measurement direction of the at least one periodic structure, and averaging the measured interference signal in a direction perpendicular to the measurement direction by scanning the SCOL target along elements of the at least one periodic structure.

11. The SCOL measurement system of claim 9, wherein the at least one illumination parameter comprises an illumination wavelength, and the multiple values thereof comprise at least three illumination wavelengths.

12. The SCOL measurement system of claim 9, further configured to calibrate the signal matrix by performing or simulating measurements of SCOL targets with known overlay values.

13. The SCOL measurement system of claim 12, further configured to create a model of the signal matrix with respect to the spot locations, illumination parameters and target overlays.

* * * * *